US006962192B2

(12) United States Patent
Lee et al.

(10) Patent No.: US 6,962,192 B2
(45) Date of Patent: Nov. 8, 2005

(54) HEAT DISSIPATION ASSEMBLY WITH RETAINING DEVICE

(75) Inventors: Hsieh Kun Lee, Tu-Chen (TW); Tao Li, Shenzhen (CN); Jin Song Feng, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/867,941

(22) Filed: Jun. 14, 2004

(65) Prior Publication Data

US 2005/0022973 A1 Feb. 3, 2005

(30) Foreign Application Priority Data

Jun. 13, 2003 (TW) .................. 92210864 U

(51) Int. Cl.⁷ .................. F28F 7/00; H01L 23/34
(52) U.S. Cl. .................. 165/80.3; 165/67; 257/718; 257/719
(58) Field of Search .................. 165/185, 80.3, 165/67, 76, 78, 80.1, 80.2; 257/718–719, 257/726–727; 361/704, 707, 709, 710; 24/457; 248/510

(56) References Cited

U.S. PATENT DOCUMENTS

| 5,542,468 | A | * | 8/1996 | Lin | 165/80.3 |
|---|---|---|---|---|---|
| 5,771,960 | A | * | 6/1998 | Lin | 165/80.3 |
| 5,870,288 | A | * | 2/1999 | Chen | 361/704 |
| 6,097,601 | A | * | 8/2000 | Lee | 361/704 |
| 6,141,220 | A | * | 10/2000 | Lin | 361/704 |
| 6,307,747 | B1 | | 10/2001 | Farnsworth et al. | |
| 6,356,446 | B1 | | 3/2002 | Guerrero | |
| 6,449,154 | B1 | * | 9/2002 | Yoneyama et al. | 361/704 |
| 6,480,384 | B2 | * | 11/2002 | Lo | 361/704 |
| 6,731,506 | B1 | * | 5/2004 | Dong et al. | 361/719 |
| 2004/0017662 | A1 | * | 1/2004 | Liu | 361/719 |
| 2004/0156171 | A1 | * | 8/2004 | Dong et al. | 361/704 |

FOREIGN PATENT DOCUMENTS

| TW | 385885 | 3/2000 |
|---|---|---|
| TW | 398641 | 7/2000 |
| TW | 471652 | 1/2002 |
| TW | 519256 | 1/2003 |
| TW | 539391 | 6/2003 |

* cited by examiner

Primary Examiner—Tho Duong
(74) Attorney, Agent, or Firm—Wei Te Chung

(57) ABSTRACT

A heat dissipation assembly includes a printed circuit board (70) with a heat-generating device (74) mounted thereon, a heat sink (60) mounted on the heat-generating device for dissipating heat therefrom, a retaining device (1) and a locating member (50). The retaining device includes a pair of spaced pressing portions (14) pressing on the heat sink, and a pair of pivot portions (34) pivotally engaged with the pressing portions respectively. The locating member includes a baseplate (52) located at an underside of the printed circuit board, and four pins (54) extending from the baseplate. The pins pass through the printed circuit board and the heat sink. Two of the pins are engaged by the pressing portions, and the other two pins are engaged by the pivot portions when the pivot portions are pivotally moved toward the printed circuit board.

13 Claims, 3 Drawing Sheets

HEAT DISSIPATION ASSEMBLY WITH RETAINING DEVICE

BACKGROUND OF THE INVENTION

1. Field of the Invention

The present invention relates to heat sinks and their retention on heat-generating devices such as electronic packages, and more particularly to a heat dissipation assembly having a retaining device securely retaining a heat sink on a heat-generating device.

2. Description of Prior Art

Numerous modern electronic devices such as central processing units (CPUs) of computers generate large amounts of heat during operation. The heat must be efficiently removed from the CPU; otherwise, abnormal operation or damage may result. Typically, a retaining device attaches a heat sink on the heat-generating device to remove heat therefrom.

A common kind of retaining device comprises a retention frame and a clip. The retention frame is mounted on a printed circuit board (PCB), and surrounds a heat-generating device such as a CPU that is also mounted on the PCB. The retention frame forms a pair of ears at opposite sides thereof. The clip comprises a central pressing portion pressing a heat sink onto the CPU, and a pair of clamping legs depending from opposite ends of the pressing portion. The legs each define an opening therein, the openings of the legs engagingly receiving the ears of the retention frame. Thus, the heat sink is resiliently attached on the CPU to remove heat therefrom.

With the rapid development of electronics technology, CPUs are now able to process signals at unprecedented high speeds. As a result, CPUs can generate huge amounts of heat. To maintain an acceptably low operating temperature of a high-speed CPU, a heat sink must have great heat dissipation capability. A popular way to achieve this is to simply provide heat sinks that are larger and heavier than previously. However, many conventional retaining devices such as the common one described above are not strong enough to securely retain a bulky, heavy heat sink on the CPU. The heat sink is liable to shift relative to the CPU when the assembly is subjected to vibration or shock during use. This can adversely affect the efficiency of heat removal. The heat sink may even disengage from the CPU altogether.

SUMMARY OF THE INVENTION

Accordingly, an object of the present invention is to provide a heat dissipation assembly having a retaining device which easily and securely retains a heat sink on a heat-generating device such as an electronic package.

In order to achieve the object set out above, a heat dissipation assembly in accordance with a preferred embodiment of the present invention comprises a printed circuit board with a heat-generating device mounted thereon, a heat sink mounted on the heat-generating device for dissipating heat therefrom, a retaining device and a locating member. The retaining device includes a pair of spaced pressing portions pressing on the heat sink, and a pair of pivot portions pivotally engaged with the pressing portions respectively. The locating member includes a baseplate located at an underside of the printed circuit board, and four pins extending from the baseplate. The pins pass through the printed circuit board and the heat sink. Two of the pins are engaged by the pressing portions, and the other two pins are engaged by the pivot portions when the pivot portions are pivotally moved toward the printed circuit board. Thus, central sections of the pressing portions resiliently press down on the heat sink. Simultaneously, the heat sink presses down on the heat-generating device, and the baseplate of the locating member presses up against and firmly abuts the printed circuit board. The retaining device and the locating member thus firmly retain the heat sink on the heat-generating device, in order to provide effective dissipation of heat from the heat-generating device.

Other objects, advantages and novel features of the present invention will become more apparent from the following detailed description when taken in conjunction with the accompanying drawings, in which:

DETAILED DESCRIPTION OF THE INVENTION

Figure 1:
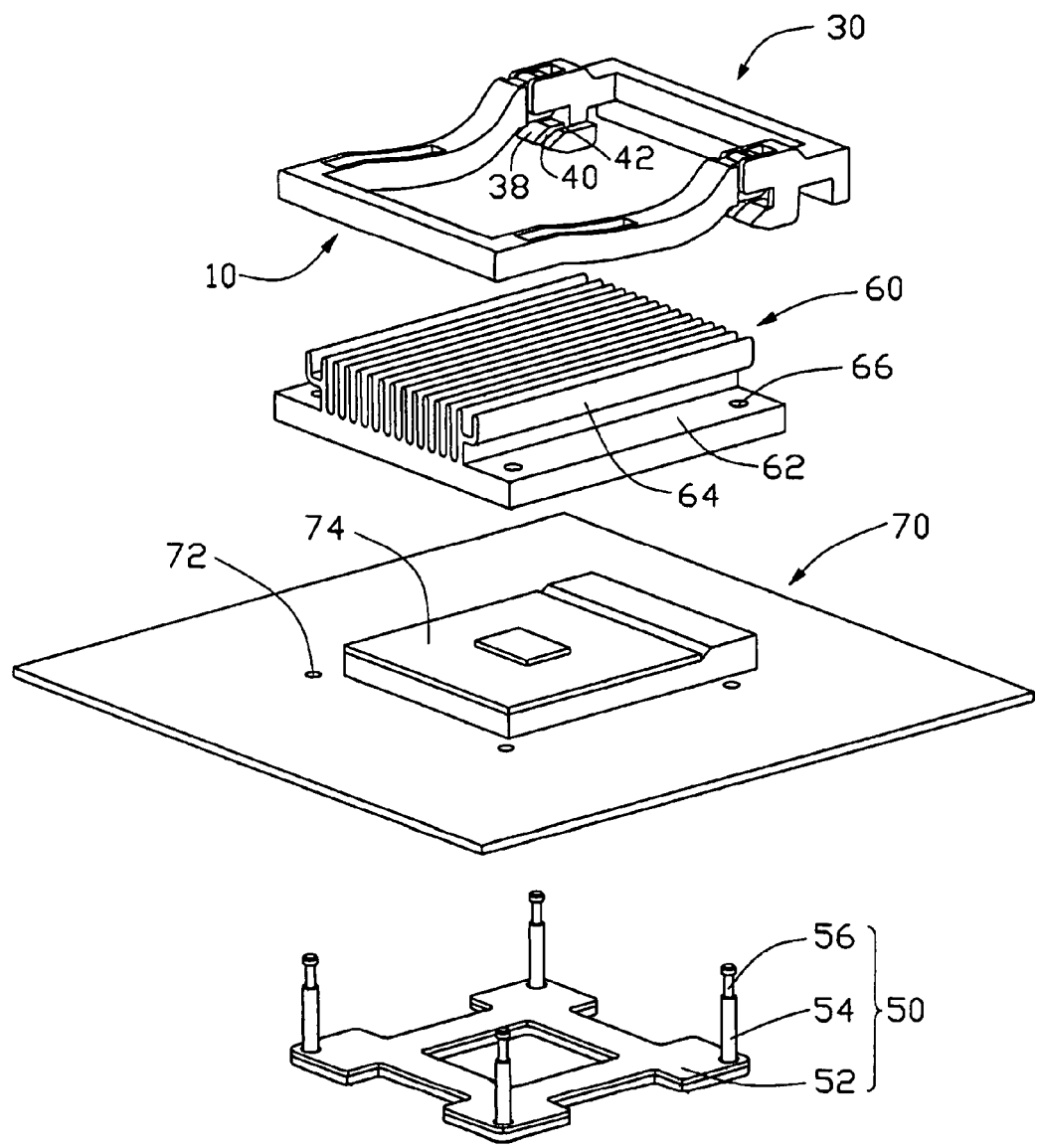
FIG. 1 is an exploded, isometric view of a heat dissipation assembly in accordance with the preferred embodiment of the present invention.
Figure 2:
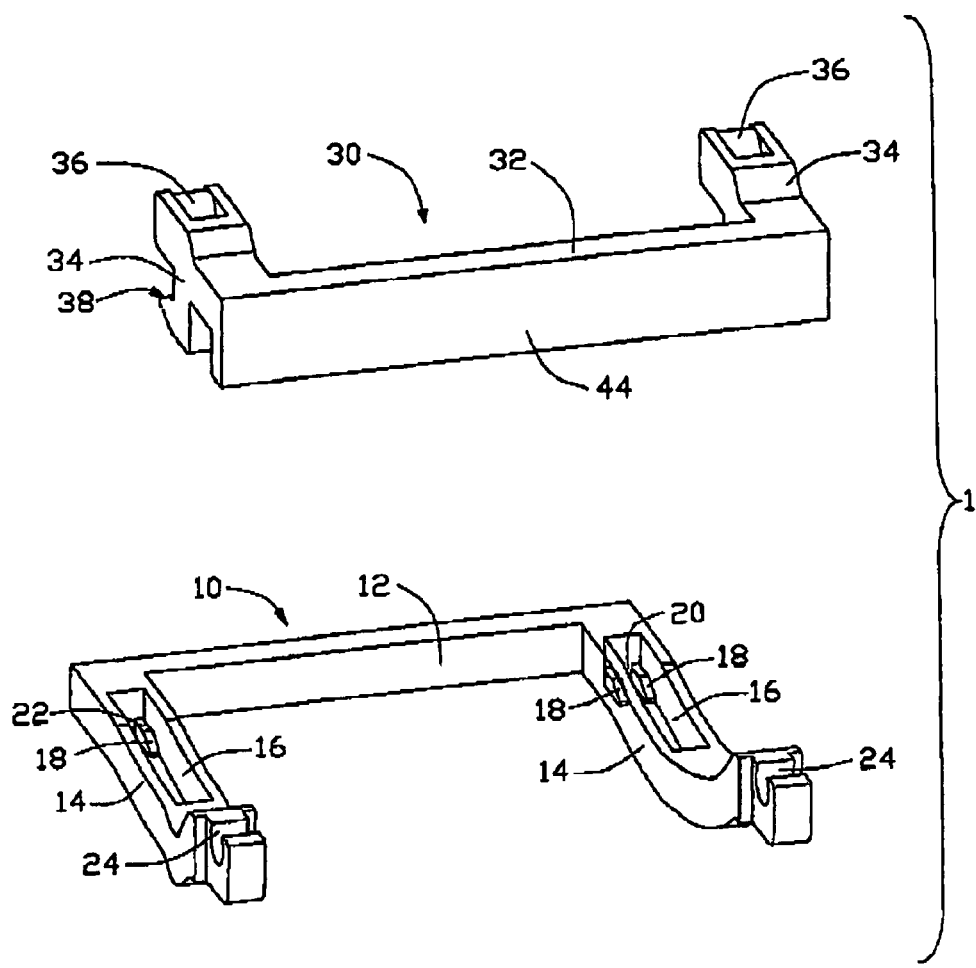
FIG. 2 is an exploded view of a retaining device of the heat dissipation assembly of FIG. 1.
Figure 3:
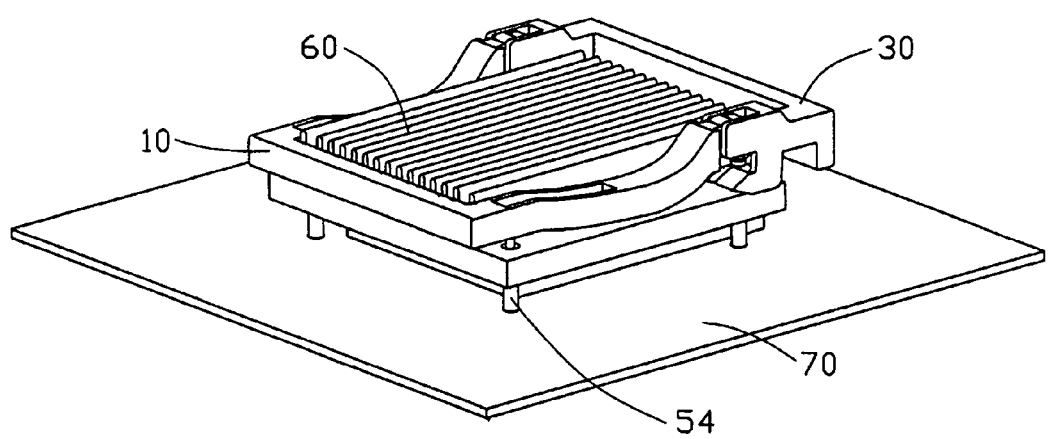
FIG. 3 is an assembled view of FIG. 1.

Referring to FIGS. 1–3, a heat dissipation assembly in accordance with the preferred embodiment of the present invention comprises a retaining device 1, a locating member 50, a heat sink 60, and a printed circuit board (PCB) 70. The retaining device 1 cooperates with the locating member 50 to sandwich the heat sink 60 and the PCB 70 therebetween.

The PCB 70 has a heat-generating device 74 mounted thereon, and defines four apertures 72 surrounding the heat-generating device 74. The heat sink 60 comprises a base 62 abutting a top of the heat-generating device 74, and a plurality of parallel fins 64 extending perpendicularly from the base 62. A pair of spaced through holes 66 is defined in the base 62 at each of opposite sides of the fins 64, the through holes 66 corresponding to the apertures 72 of the PCB 70.

The locating member 50 comprises a baseplate 52 for abutting a bottom surface of the PCB 70, and four pins 54 extending upwardly from four corners of the baseplate 52 respectively. The pins 54 correspond to the apertures 72 and the through holes 66. Each pin 54 has a narrowed neck 56 at an end thereof distal from the baseplate 62.

Referring to FIG. 2, the retaining device 1 is essentially a square frame, comprising a pressing member 10 and an operating member 30 pivotably attached to the pressing member 10. The pressing member 10 comprises a horizontal beam 12, and a pair of curved pressing portions 14 extending in a same direction from opposite ends of the horizontal beam 12 respectively. A central elongated groove 16 is defined through each pressing portion 14. A pair of opposite first sills 22 is formed in each groove 16 adjacent the beam 12. Each first sill 22 comprises a first slope 18 distal from the beam 12. A first slot 20 is defined between each pair of first sills 22, the first slot 20 being in communication with the corresponding groove 16. A pivot cutout 24 is defined in a top of a distal end of each pressing portion 14.

The operating member 30 comprises a horizontal lever 32, and a pair of pivot portions 34 extending in a same direction from opposite ends of the horizontal lever 32 respectively. A pivot 36 is formed at a top distal end of each pivot portions 34. A pair of second sills 42 extends from a bottom distal end of each pivot portion 34. Each second sill 42 comprises a second slope 38 distal from the lever 32. A second slot 40 is defined between each pair of second sills 42. A handle 44 extends downwardly from the lever 32. The pivots 36 are pivotably received into the pivot cutouts 24 of the pressing member 10, thereby forming the retaining device 1. The handle 44 facilitates pivoting of the operating member 30 relative to the pressing member 10.

In assembly of the heat dissipation assembly, the pins 54 of the locating member 50 are inserted upwardly through the apertures 72 of the PCB 70 and the through holes 66 of the heat sink 60. The retaining device 1 is placed onto the heat sink 60. The pressing portions 14 are located above the base 62 between corresponding through holes 66, and the retaining device 1 thus surrounds the fins 64 of the heat sink 60. The retaining device 1 is positioned so that two of the pins 54 extend into the grooves 16 of the pressing member 10. The retaining device 1 is pushed horizontally. The necks 56 of the pins 54 are received in the first slots 20, and heads (not labeled) of the pins 54 are slidably engaged on the first slopes 18. The retaining device 1 is continued to be pushed so that the heads of the pins 54 slide up along the first slopes 18 and are engaged on main portions of the first sills 22. Accordingly, end sections of the pressing portions 14 adjacent the beam 12 are driven down closer to the base 62 of the heat sink 60, while opposite end sections of the pressing portions 14 and the operating member 30 are driven up farther away from the base 62.

The operating member 30 is then pivoted down toward the base 62 of the heat sink 60. The necks 56 of the other two pins 54 are received in the second slots 40, and heads (not labeled) of the pins 54 are slidably engaged on the second slopes 38. The operating member 30 is continued to be pivoted so that the heads of the pins 54 slide up along the second slopes 38 and are engaged on main portions of the second sills 42. At this stage, the second slopes 38 are symmetrically opposite to the corresponding fist slopes 18. Central sections of the pressing portions 14 resiliently press down on the base 62 of the heat sink 60. Simultaneously, the base 62 presses down on the heat-generating device 74, and the baseplate 52 of the locating member 50 presses up against and firmly abuts the bottom surface of the PCB 70. The retaining device 1 and the locating member 50 thus firmly retain the heat sink 60 on the heat-generating device 74, in order to provide effective dissipation of heat from the heat-generating device 74.

In an alternative embodiment of the present invention, the retaining device 1 of the heat dissipation assembly is not a square frame. Instead, the pressing portions 14 of the pressing member 10 are separate pieces, there being no beam 12. The pivot portions 34 of the operating member 30 are also separate pieces, there being no lever 32.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly comprising:
   a printed circuit board with a heat-generating device mounted thereon;
   a heat sink mounted on the heat-generating device for dissipating heat therefrom;
   a retaining device, comprising a pair of pressing portions pressing on the heat sink and a pair of pivot portions pivotally engaged with the pressing portions respectively; and
   a locating member comprising a baseplate located at an underside of the printed circuit board, and four pins extending from the baseplate, the pins passing through the printed circuit board and the heat sink;
   wherein two of the pins are engaged by the pressing portions respectively, and the other two pins are engaged by the pivot portions when the pivot portions are pivoted toward the printed circuit board.

2. The heat dissipation assembly of claim 1, wherein upper sections of the pivot portions are pivotably attached to the pressing portions respectively, and lower sections of the pivot portions are engaged with said other two pins.

3. The heat dissipation assembly of claim 2, wherein each of the pressing portions defines an elongated groove therein.

4. The heat dissipation assembly of claim 3, wherein a pair of first sills is formed in each of the grooves, the first sills being distal from the pivot portions.

5. The heat dissipation assembly of claim 4, wherein each of the first sills comprises a first slope generally facing toward a corresponding pivot portion.

6. The heat dissipation assembly of claim 4, wherein a first slot is defined between each pair of the first sills, the first slot being in communication with a corresponding groove.

7. The heat dissipation assembly of claim 6, wherein each of said lower sections forms a pair of second sills corresponding to respective first sills.

8. The heat dissipation assembly of claim 7, wherein each of the second sills comprises a second slope generally symmetrically opposite to a corresponding first slope.

9. The heat dissipation assembly of claim 8, wherein a second slot is defined between each pair of the second sills.

10. The heat dissipation assembly of claim 9, wherein said two of the pins are engagingly received in the first slots via the first slopes respectively, and said other two pins are engagingly received in the second slots via the second slopes respectively.

11. The heat dissipation assembly of claim 1, wherein each of the pins comprises a neck distal from the baseplate, the necks being engaged with the pressing portions and the pivot portions respectively.

12. The heat dissipation assembly of claim 1, wherein the pressing portions are curved.

13. The heat dissipation assembly of claim 2, wherein a pivot is formed at each of said upper sections, each of the pressing portions defines a pivot cutout, the pivots being received in the cutouts.

* * * * *